(12) United States Patent
Patra et al.

(10) Patent No.: US 6,529,861 B1
(45) Date of Patent: Mar. 4, 2003

(54) POWER CONSUMPTION REDUCTION FOR DOMINO CIRCUITS

(75) Inventors: Priyadarsan Patra, Portland, OR (US); Unni K. Narayanan, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/347,842

(22) Filed: Jul. 2, 1999

(51) Int. Cl.[7] .............................. G06F 17/50; G06G 7/62
(52) U.S. Cl. .............................. 703/14; 703/15; 703/18; 703/13; 716/2
(58) Field of Search .................... 703/6, 22, 2; 713/601, 713/322; 716/6, 7, 8, 4, 18; 705/7, 10, 8, 37; 702/119; 435/6; 395/500.06

(56) References Cited

U.S. PATENT DOCUMENTS

| | | | |
|---|---|---|---|
| 4,697,109 A | 9/1987 | Honma et al. | 307/475 |
| 4,899,066 A | 2/1990 | Aikawa et al. | 307/45.2 |
| 5,258,666 A | 11/1993 | Furuki | 307/449 |
| 5,453,708 A | 9/1995 | Gupta et al. | 326/98 |

(List continued on next page.)

FOREIGN PATENT DOCUMENTS

| | | | |
|---|---|---|---|
| EP | 0954101 | 3/1999 | H03K/19/096 |
| JP | 59-039124 | 3/1984 | H03K/19/096 |
| JP | 04-239221 | 8/1992 | H03K/19/096 |

OTHER PUBLICATIONS

Puri et al., "Logic optimization by output phase assignment in dynamic logic synthesis", IEEE/ACM International Conference on Computer–Aided design, 1996.*

Xun Liu et al., "Minimizing sensitivity to delay vatriations in high performance synchronous circuits", Design, Automation and Test in Europe Confrerence, Mar., 1999.*

Thompson, S., et al., "Dual Threshold Voltages and Substrate Bias: Keys to High Performance, Low Power, 0.1 um Logic Designs", *1997 Symposium on VLSI Technology Digest of Technical Papers*, 69–70, (1997).

Bryant, R.E., "Graph–Based Algorithms for Boolean Function Manipulation", *IEEE Transactions on Computers, C–35 (8)*, 677–691, (1986).

Chakradhar, S.T., et al., "An Exact Algorithm for Selecting Partial Scan Flip–Flops", *Proceedings, 31st Annual Design Automation Conference*, San Diego, California, 81–86, (1994).

Chakravarty, S., "On the Complexity of Using BDDs for the Synthesis and Analysis of Boolean Circuits", *27th Annual Allerton Conference on Communication, Control, and Computing*, Allerton House, Monticello, Illinois., 730–739, (1989).

Patra, P., et al., "Automated Phase Assignment for the Synthesis of Low Power Domino Circuits", 379–384.

Puri, et al., "Logic Optimization by Output Phase Assignment in Dynamic Logic Synthesis", *International Conference on Computer Aided Design*, 2–8, (1996).

* cited by examiner

*Primary Examiner*—Samuel Broda
*Assistant Examiner*—Kandasamy Thangavelu
(74) *Attorney, Agent, or Firm*—Schwegman, Lundberg, Woessner & Kluth, P.A.

(57) ABSTRACT

A system and method which reduce power consumption of a domino circuit. An initial phase assignment for outputs of the domino circuit is generated. A final phase assignment that reduces power consumption of the domino circuit is determined. The final phase assignment is selected from at least one additional phase assignment. The power consumption of domino circuits can be reduced by utilizing the methods and systems disclosed.

12 Claims, 16 Drawing Sheets

U.S. PATENT DOCUMENTS

| | | | |
|---|---|---|---|
| 5,543,735 A | 8/1996 | Lo | 326/93 |
| 5,568,062 A | 10/1996 | Kaplinsky | 326/27 |
| 5,657,256 A * | 8/1997 | Swanson et al. | 702/119 |
| 5,661,675 A | 8/1997 | Chin et al. | 364/768 |
| 5,671,151 A | 9/1997 | Williams | 364/489 |
| 5,731,983 A * | 3/1998 | Balakrishnan et al. | 716/18 |
| 5,748,012 A | 5/1998 | Beakes et al. | 326/93 |
| 5,796,282 A | 8/1998 | Sprague et al. | 327/210 |
| 5,815,005 A | 9/1998 | Bosshart | 326/95 |
| 5,825,208 A | 10/1998 | Levy et al. | 326/98 |
| 5,831,990 A | 11/1998 | Queen et al. | 371/22.1 |
| 5,852,373 A | 12/1998 | Chu et al. | 326/98 |
| 5,886,540 A | 3/1999 | Perez | 326/93 |
| 5,892,372 A | 4/1999 | Ciraula et al. | 326/96 |
| 5,896,046 A | 4/1999 | Bjorksten et al. | 326/98 |
| 5,896,399 A | 4/1999 | Lattimore et al. | 371/21.1 |
| 5,898,330 A | 4/1999 | Klass | 327/210 |
| 5,917,355 A | 6/1999 | Klass | 327/208 |
| 5,942,917 A | 8/1999 | Chappell et al. | 326/121 |
| 5,986,399 A | 11/1999 | Lattimore et al. | 371/21.4 |
| 6,002,272 A | 12/1999 | Somasekhar et al. | 326/98 |
| 6,002,292 A | 12/1999 | Allen et al. | 327/379 |
| 6,049,231 A | 4/2000 | Bosshart | 326/98 |
| 6,052,008 A | 4/2000 | Chu et al. | 327/200 |
| 6,060,910 A | 5/2000 | Inui | 326/98 |
| 6,086,619 A * | 7/2000 | Hausman et al. | 703/6 |
| 6,087,855 A | 7/2000 | Frederick, Jr. et al. | 326/106 |
| 6,090,153 A * | 7/2000 | Chen et al. | 716/8 |
| 6,104,212 A | 8/2000 | Curran | 326/95 |
| 6,108,805 A | 8/2000 | Rajsuman | 714/724 |
| 6,132,969 A * | 10/2000 | Stouhton et al. | 435/6 |
| 6,133,759 A | 10/2000 | Beck et al. | 326/98 |
| 6,204,696 B1 | 3/2001 | Krishnamurthy et al. | 326/98 |
| 6,363,515 B1 * | 3/2002 | Rajagopal et al. | 716/5 |
| 2001/0014875 A1 * | 8/2001 | Young et al. | 705/37 |

POWER CONSUMPTION REDUCTION FOR DOMINO CIRCUITS

FIELD

This invention relates generally to domino circuits, and more particularly to power consumption reduction for domino circuits.

BACKGROUND

The speeds at which electronic circuits are required to perform is constantly increasing. As the overall processor speed becomes faster, the need for faster internal circuitry has increased. The need for high speed circuits is not limited to processors, but applies everywhere from cellular phones to digital broadcast receiver systems. Many hand held devices use application specific integrated circuits (ASICs) and they must approach microprocessor frequency targets but have an even tighter area budget. A way to increase the speed of a circuit is to use domino circuits (dynamic logic circuits) instead of static CMOS circuits. A domino circuit includes one or more domino gates. A typical domino gate has a precharge transistor, an evaluate transistor, and an inverting buffer. Domino circuits are generally faster than circuits implemented in CMOS static circuits. For example, domino circuits typically account for thirty percent of the logic transistors of a microprocessor.

The power consumption of domino circuits is attributed to precharging every cycle and to dual-rail logic duplication. A domino functional unit block typically dissipates up to four times as much power as an equivalent static functional unit block. These power problems are magnified with the increasing popularity of portable battery operated devices such as cellular phones and laptop computers which must operate at low power consumptions. The ASICs used in these applications are required to operate fast but consume small amounts of power.

The use of domino circuits in high-performance microprocessor design is an efficient way of increasing circuit speed and reducing area. Domino logic allows a single clock to precharge and evaluate a cascade of dynamic logic blocks and requires incorporating a static CMOS inverting buffer at the output of each dynamic logic gate. Despite various area and speed advantages, the inherently non-inverting nature of domino gates requires the implementation of logic network without inverters. Domino circuits typically dissipate four times as much power as an equivalent static circuit.

Currently, a way to convert a logic circuit into an inverter free domino logic circuit is to convert the logic circuit into AND, OR, and NOT gates only. Then, the inverters can be propagated back from the primary outputs towards the inputs by applying simple De Morgan's laws. Some inverters may not be capable of being propagated all the way to a primary input and will be trapped. Since these inverters cannot be removed, the gate which the inverter is trapped requires duplication to be implemented. This duplication generally causes substantial area and substantial power consumption penalties.

Attempts have been made to reduce the area used by domino circuits but these generally result in relatively large power consumption. What is needed is a way to reduce the power used by domino circuits.

SUMMARY

One embodiment of the present invention provides a method for reducing power consumption of a domino circuit. An initial phase assignment for outputs of the domino circuit is generated. A final phase assignment that reduces power consumption of the domino circuit is determined. The final phase assignment is selected from at least one additional phase assignment.

In another embodiment, the present invention provides a method for reducing power consumption of a domino circuit. An initial output phase assignment for outputs of the domino circuit is generated. A first power consumption of the domino circuit using the initial output phase assignment output of the circuit is computed. A plurality of additional output phase assignments is generated. For each one of the plurality of additional output phase assignments a power consumption of the domino circuit using each of the plurality additional output phase assignments is evaluated. For each one of the plurality of additional output phase assignments, the power consumption of the domino circuit using each of the plurality additional output phase assignments is compared to the first power consumption. For each one of the plurality of additional output phase assignments, either the initial output phase assignment or one of the plurality additional output phase assignments is selected.

DETAILED DESCRIPTION

Approaches to reduce power used by an implementation in a domino circuit or dynamic circuit are described herein.

It will be understood by reading the description that there is a relation between power consumption and phase assignments for domino circuits. Thus, the power consumption of a domino circuit can be reduced by manipulating the phase assignments for the domino gates in the domino circuit. Any number of approaches may be used to reduce the power used by manipulating the phase assignments. One approach is a heuristic approach that generates an initial phase assignment and generates new phase assignments until an assignment is reached that greatly reduces power output by the circuit. This approach is fast and results in greatly reduced power usage by the domino circuit. Another approach uses a mixed integer linear approach that generates coefficients for each gate that correspond to the cost of that gate in terms of power. These coefficients are entered into a mixed integer linear equation. The equation is solved and produces the optimum phase assignment for minimal power usage by the domino circuit.

In the following detailed description of exemplary embodiments of the invention, reference is made to the accompanying drawings which form a part hereof, and in which are shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the claims.

Figure 1:
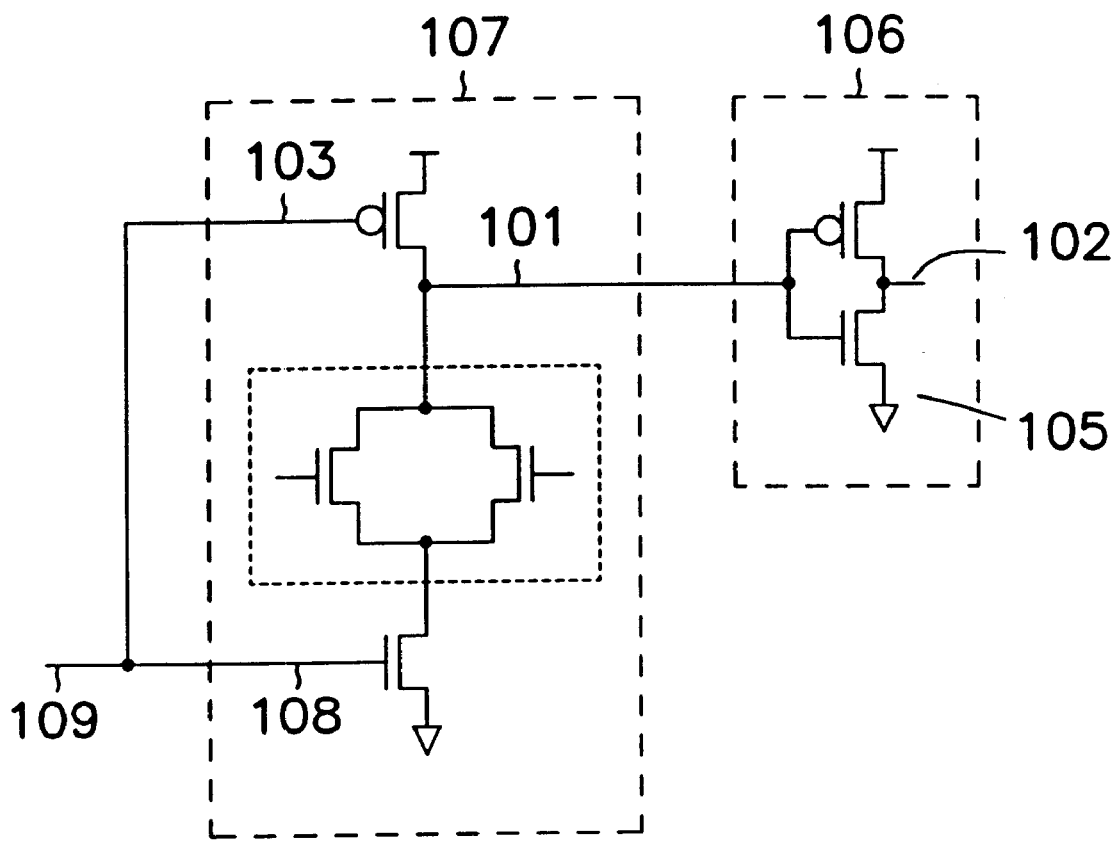
FIG. 1 is a basic domino gate.

The domino circuit is a circuit that is made up by at least some domino gates. A basic N-type domino gate is shown in FIG. 1. FIG. 1 shows an output $O_1$ 101 of the dynamic gate, an output $O_2$ 102 of the static gate, a precharge transistor 103, a dynamic portion 107, a static portion 106, an inverting buffer 105, an evaluate transistor 108, and a clock 109. A domino gate consists of a dynamic component and a static component. During a precharge phase, the output of the dynamic gate is precharged high, and the output of the buffer is low. When the gate is evaluated, the output will conditionally discharge and result in the output conditionally becoming high. Domino gates are inherently noninverting.

In CMOS technology, a large portion of power dissipation on a chip is due to dynamic power consumption at the gates which is computed according to the formula:

$$\sum_{i=1}^{N} \frac{1}{2} C_i V_{dd}^2 f_i$$

where $C_i$ is the output capacitance of the ith gate, Vdd is the supply voltage, fi is the number of transitions at the output of the ith gate, and N is the total number of gates on the chip. Hence, power consumption is linearly related to the switching activity fi of a gate, and clearly a reduction in fi will lead to a corresponding reduction in the total power consumption of the circuit. For a domino circuit as shown in FIG. 1., the signal probability of a gate is the probability that the logical output of a gate is high and the switching probability of a gate is the probability that the output experiences a transition. So, if $p_g$ is the signal probability of logical output $O_2$ of gate g, then $S_g$, the switching probability at both $O_1$ and $O_2$ is exactly $p_g$. If the logical output of $O_2$ is high, then the output $O_1$ must be low. This means that the dynamic portion of the gate discharged the precharged current. Furthermore, the output will need to be precharged during the next clock cycle. Thus, the probability of a transition at $O_1$ is precisely the signal probability at $O_2$. Furthermore, $O_2$'s output experiences a transition if and only if $O_1$ experiences a transition. Hence, the switching probability at $O_2$ is also the signal probability at $O_2$.

Figure 2:
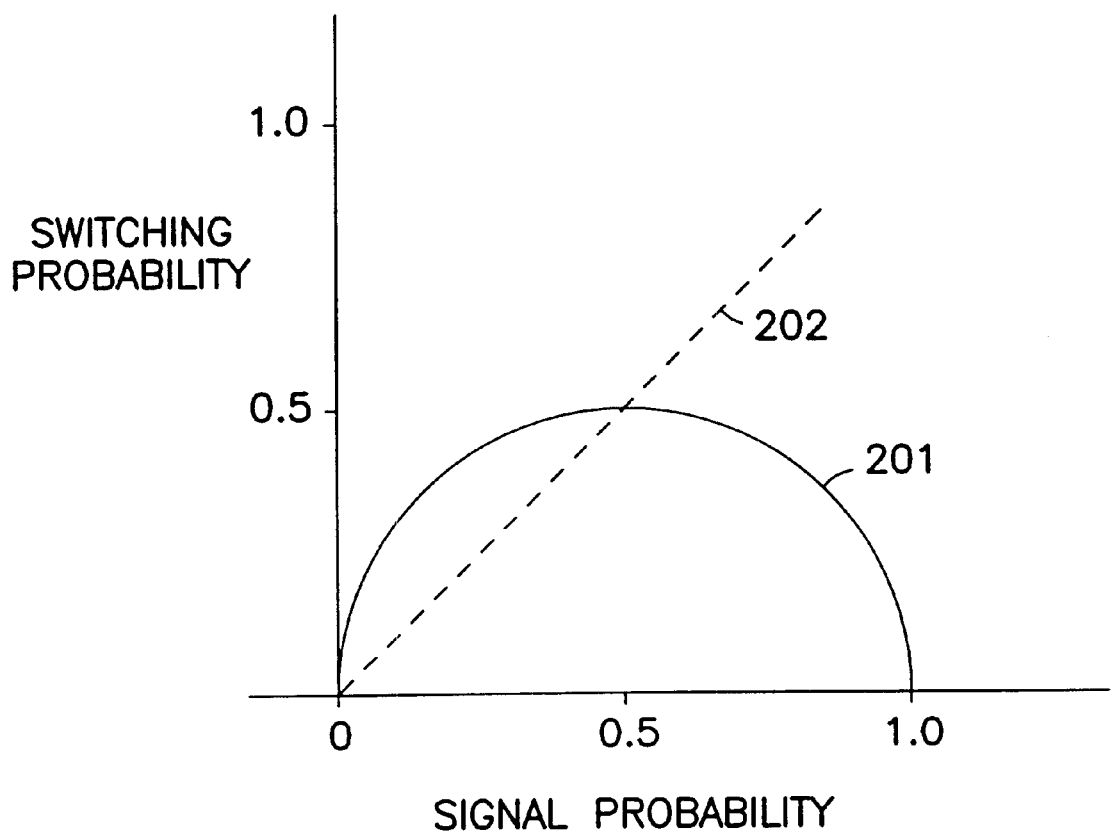
FIG. 2 shows signal probability and switching for domino and static CMOS logic.

In the case where the logical output of the gate at $O_2$ remains "0", no charging or discharging takes place anywhere in the gate, and so no power is dissipated. In contrast to static gates, domino gates experience an asymmetry in switching activity with respect to signal probability. FIG. 2 compares the two types of gates.

Once a gate discharges current, its output cannot be recharged until the next clock cycle. Hence, any glitch that appears at the inputs of a domino block sets a chain of monotonic transitions that cannot be reversed until the next clock cycle. The consequence is that since domino gates never glitch, the switching activity can be modeled correctly under a zero delay assumption. Therefore, if we have the exact signal probability for each logical output of a domino gate, then we have an exact measure of the total switching activity in a domino block.

Domino blocks must be synthesized without logical inverters because domino logic is inherently noninverting. Thus, to implement logic into domino logic, the logic must be inverter free. An article, Puri, Bjorksten, and Rosser, "Logic optimization by output phase assignment in dynamic logic synthesis, International Conference on Computer Aided Design, pages 2–8, 1996, proposes a method for synthesizing inverter free blocks. First, perform a standard technology independent synthesis. Inverters will appear at arbitrary points in this initial realization. Then, systematically remove inverters by changing the phase of primary outputs and applying DeMorgan's Law. Refer to FIGS. 3A, 3B, 3C and 3D for an illustration of one example of this method. For example, to synthesize the logic functions:

$$f=\overline{(a+b)+(c \times a)}$$

$$g=(a+b)+(c \times d)$$

Figure 3A:
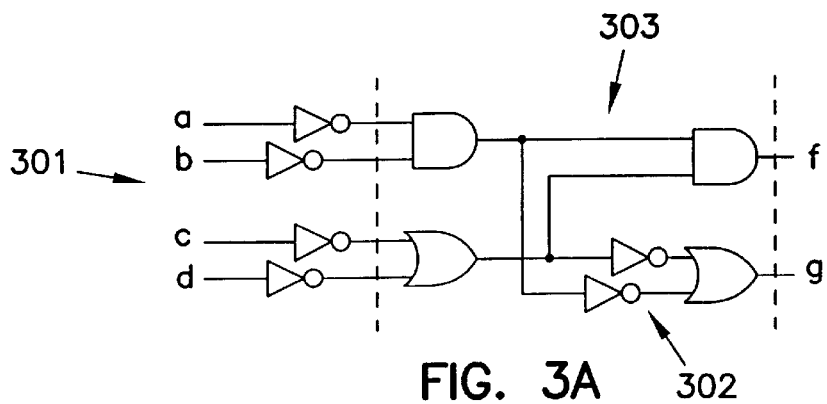
FIGS. 3A, 3B, 3C and 3D show an example of removing inverters.
Figure 3B:
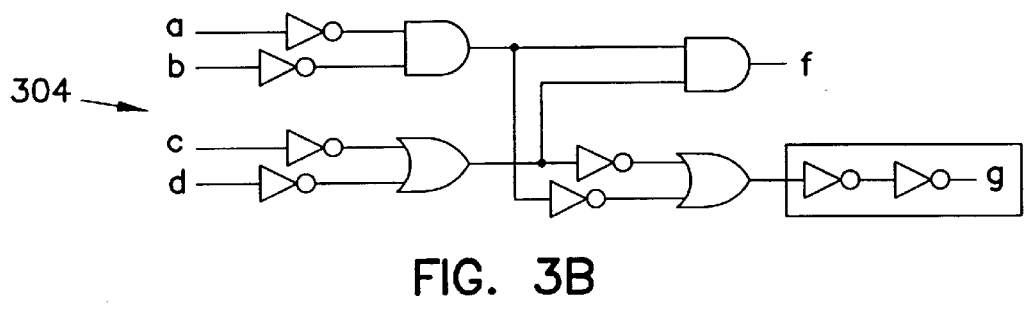
Figure 3C:
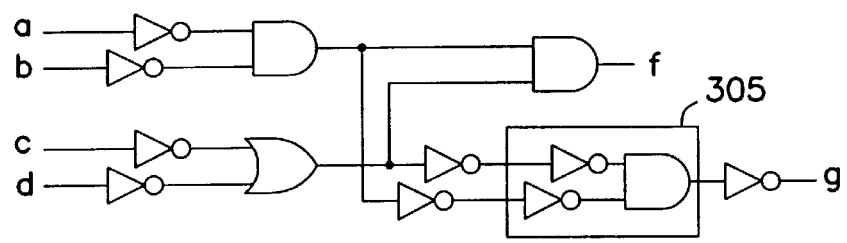
Figure 3D:
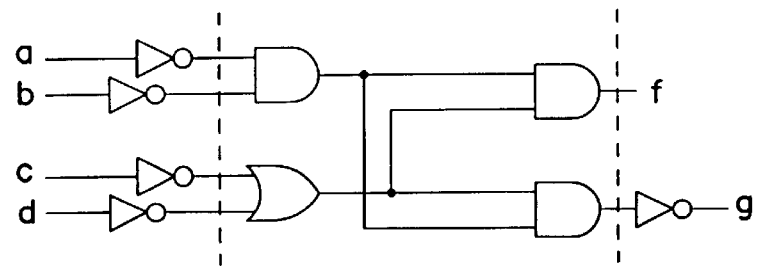
Figure 4A:
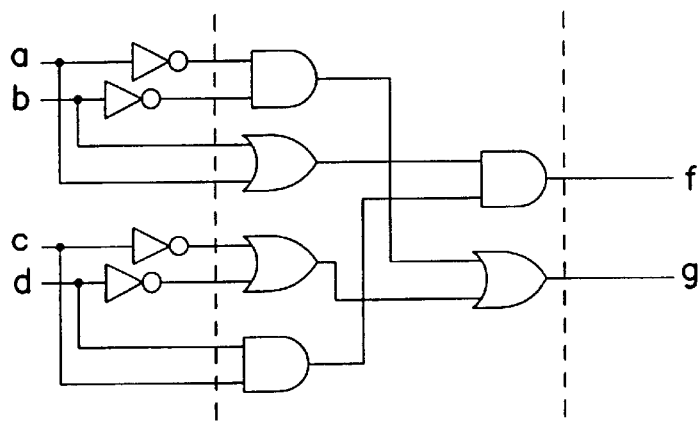
FIGS. 4A, 4B, 4C and 4D show an example of trapped inverters.
Figure 4B:
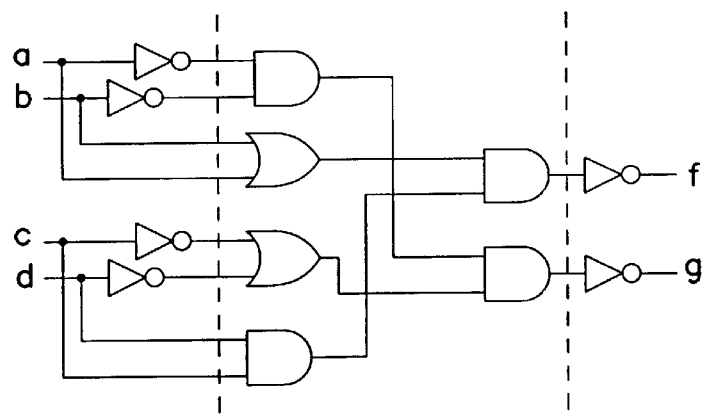
Figure 4C:
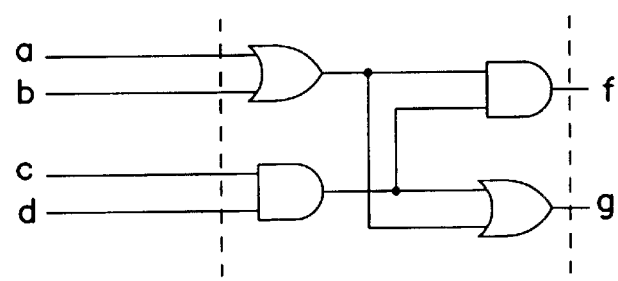
Figure 4D:
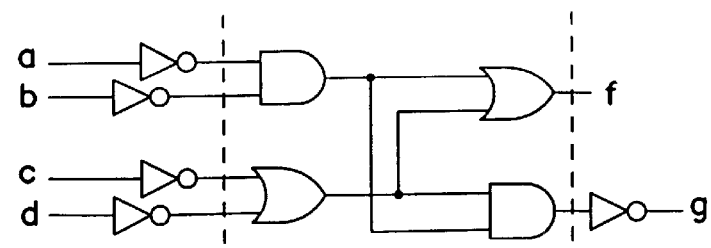

First, an initial synthesis is implemented in FIG. 3A. FIG. 3A shows an initial result of technology independent synthesis 301. The zone within the boundaries 303 must become inverterless, so the inverters 302 need to be removed. Note that this realization 301 cannot be implemented in domino logic because of the internal inverters. Hence, "changing the phase" 304 of output g is tried in FIG. 3B. An output is in positive phase if no inverter appears at the output boundary. An output is in negative phase if an inverter appears on the output boundary. Note that a "negative phase" assignment does not mean that the polarity of the output is changed. A negative phase assignment does not mean that we are implementing the complement of the original output. In the example, the initial synthesis of f is implemented in the negative phase, and g is implemented in the positive phase. In FIG. 3B, the phase of g is changed (and preserves the logical value of g) by placing two "logical" inverters on the output g. In FIG. 3C, the inverter is pushed back and DeMorgan's law is applied 305 to transform the OR gate into an AND gate. Finally, as shown in FIG. 3D, the chained inverters are removed. In general, phase assignment is not as straightforward as this example. The reason is that the backward propagation of inverters may result in "trapped inverters" which cannot be removed without significant logic duplication. For an example of "trapped inverters" consider FIGS. 4A, 4B, 4C, and 4D. In FIG. 4A and FIG. 4B, if f and g are implemented in the positive phase or if they are implemented in the negative phase, then an area penalty in terms of duplicated logic occurs. In general, if a circuit has k outputs then there are $2^k$ possible phase assignments for the circuit. This is because phase assignments for different outputs interact and affect the final realization of the circuit.

Past efforts for the problem of phase assignment have focused on inverter removal for minimum area. Hence, their primary objective is to minimize duplication of area for combinational domino circuits. However, these solutions typically consume up to 34 percent more power than the power reducing embodiments described here.

Figure 5A:
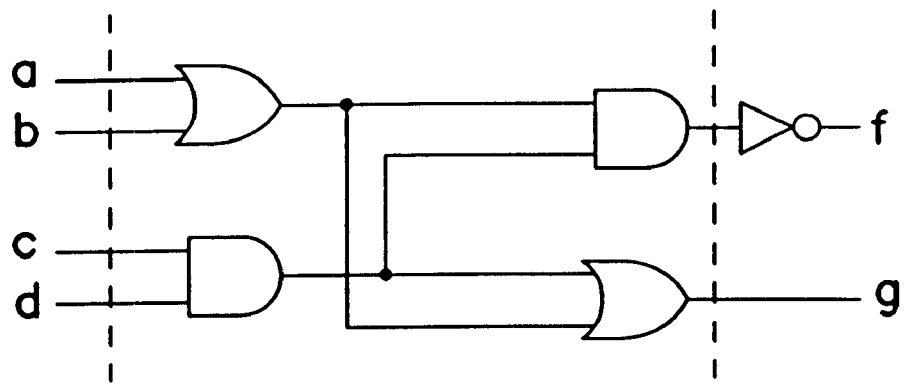
FIG. 5A shows a realization of FIG. 4C.
Figure 5B:
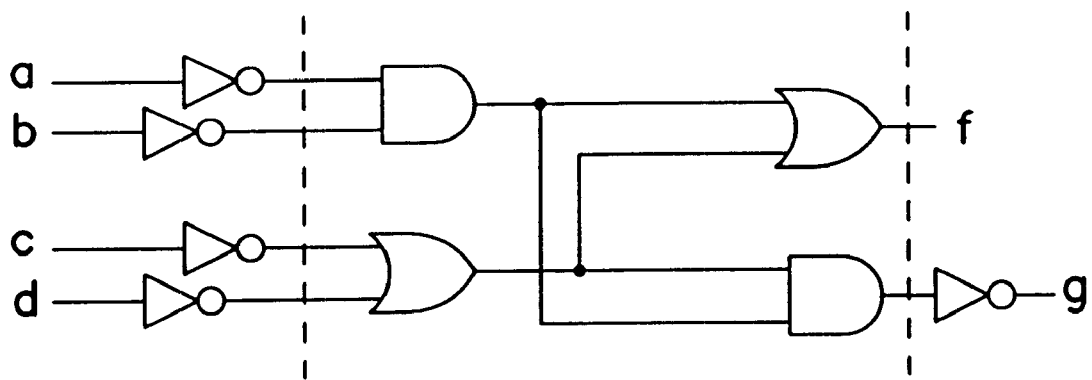
FIG. 5B shows a realization of FIG. 4D.

Different phase assignments affect the switching activity and hence power in the final domino circuit implementation. A phase assignment that reduces area does not necessarily reduce power consumptions. For example, consider FIGS. 5A and 5B which are realizations of FIGS. 4C and 4D respectively. If the primary input signal probabilities are 0.9, the second realization has 75% fewer transitions including the transitions in the static CMOS inverters at the boundaries. This is true even though the second implementation is clearly not the area minimum implementation.

The phase assignment only affects power consumption if the circuit is implemented in domino logic. For example, let the output signal probability of a gate be represented as p. If the phase of a primary output is changed, the gate may be transformed as a consequence of applying DeMorgan's Law. If the gate is transformed, the new signal probability will become 1−p. Since the switching activity of a domino gate is equivalent to the signal probability, the switching activity is also 1−p. In static CMOS gates, the switching activity is 2p(1−p) under a zero delay assumption. Thus, the symmetric behavior of CMOS gates prevents the phase assignment from affecting the switching activity.

Figure 6:
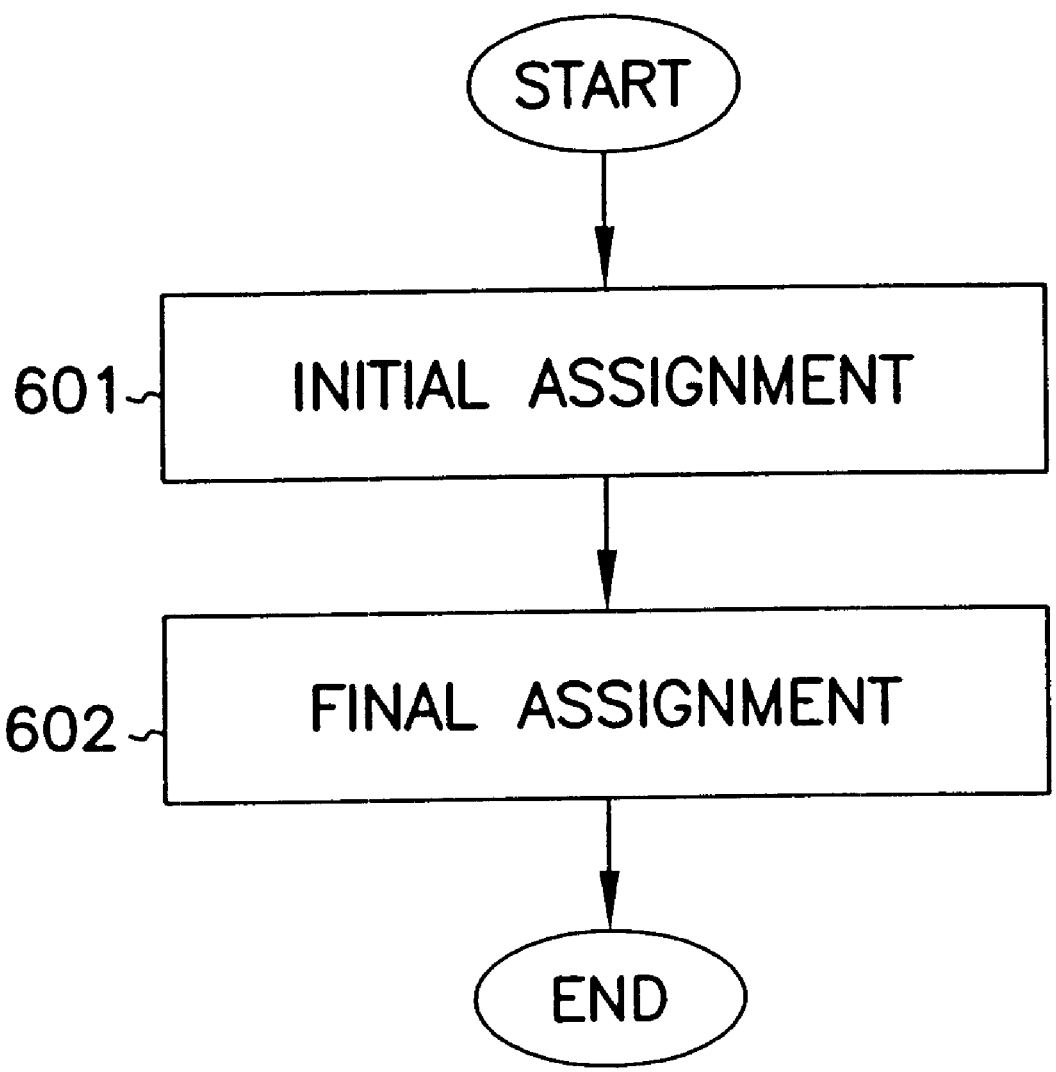
FIG. 6 is a method for reducing power consumption of a domino circuit according to an embodiment of the invention.

Referring to FIG. 6, a method for reducing power consumption of a circuit according to an embodiment of the invention is disclosed.

An initial phase assignment is generated 601. The initial phase assignment can be generated arbitrarily. A phase assignment that reduces power consumption for the circuit is determined 602. The phase assignment can be determined in any number of ways. Some ways are described as additional embodiments. Any phase assignment that reduces power consumption for the circuit will work. However, some ways will reduce power consumption more than others. The phase assignment may be determined until a reduced power phase assignment has been determined. The phase assignment may be determined by a mixed integer linear approach.

Once the domino circuit has the new phase assignment, it will generally operate using less power.

Figure 7:
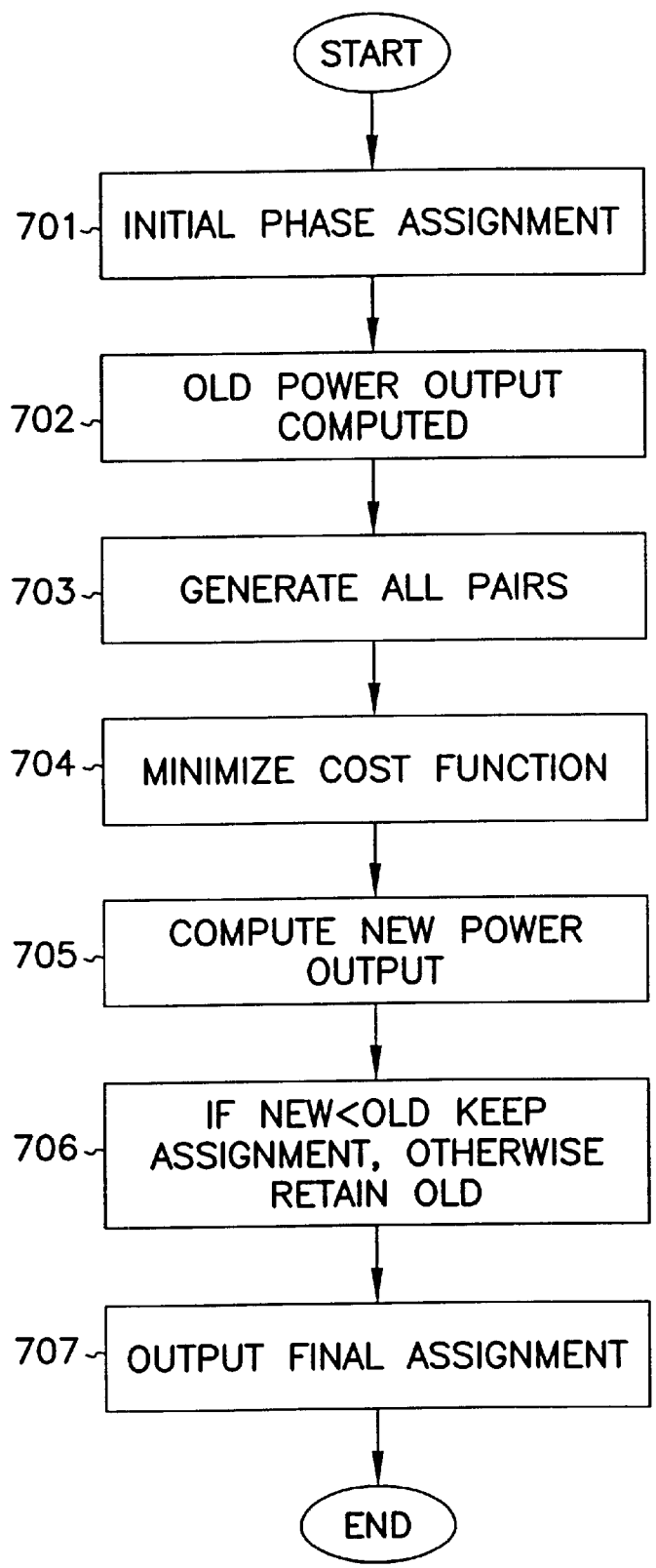
FIG. 7 is a method for reducing power consumption of a domino circuit according to an embodiment of the invention.

Referring to FIG. 7, a method for reducing power consumption of a circuit according to an embodiment of the invention is shown. An initial phase assignment for all outputs is generated 701. The initial phase assignment may be arbitrary. For example, all outputs or pairs may be set to a phase assignment of (−,−), (+,−), (−,+), or (+,+).

The power output of the circuit is computed as an old power output 702. The old power output reflects the power consumption of the circuit based on the initial phase assignment. There are various ways to measure the power output.

A set of all pairs of output phase assignments is generated 703. For example, a domino circuit with 4 outputs would have the following set of all pairs; (1,2),(1,3), (1,4), (2,3), (2,4), and (3,4).

A phase assignment is generated for each pair that minimizes the predefined cost function for the pair of outputs 704. The predefined cost function is determined by following the property that if the phase assignment of a primary output is changed and the signal probability of an individual node in the transitive fanin is p, then its new signal probability is 1−p. It is also taken into consideration that a particular choice of phase assignment might be globally worse in terms of power because of area duplication. Area duplication is due to conflicting phase assignments, and this is related to some extent to the degree of total overlap of the transitive fanin of the primary outputs. This is shown in Puri, Bjorksten, and Rosser, "Logic optimization by output phase assignment in dynamic logic synthesis," International Conference on Computer Aided Design, pages 2–8, 1996. A quantity O(ij) is defined as the overlap of primary outputs I and j and it represents the worst possible duplication penalty for incompatible phase assignments I and j respectively. The variables Di and Dj are the set of nodes in the transitive fanin of I and j respectively. An equation that provides the overlap of primary outputs is shown below.

$$O(i, j) = \frac{|Di \cap Dj|}{|Di| + |Dj|}$$

Then, the average signal probability for the pair of outputs is:

$$Ai = \frac{\sum_{n \in |Di|} Sn}{|Di|}$$

Then, the cost function for various combinations of phase assignments are defined as:

$K(i+,j+)=|Di|Ai+|Dj|Aj+0.5*O(ij)(Ai+Aj)$ $K(i-,J-)=|Di|(1-Ai)+|Cj|(1-Aj)+0.5*O(i,j)((1Ai)+(i-Aj))$ $K(i-,j+)=|Di|(1-Ai)+|Dj|Aj+0.5*O(ij)((1-Ai)+Aj)$ $K(i+,j-)=|Di|Ai+|Dj|(1-Aj)+0.5*O(ij)(Ai+(1-Aj))$

The i+ refers to retaining the current phase and i− refers to inverting the current phase.

The power output of the circuit is computed as a new power output 705. The new power output reflects the power consumption of the circuit based on the phase assignment that minimizes the predefined cost function for the pair of outputs. There are various ways to measure the power output. Some ways will be described later.

If it is determined that the new power output is less than the old power output, the phase assignment that minimized the cost function is retained and the old power output is set equal to the new power output 706. The cost function can be based on power. Otherwise, the phase assignment for the pair is replaced with the initial phase assignment 706. This means that despite our minimization efforts for the pair, the power consumption for the overall circuit may increase by changing it. This is due to the fact that the phase assignment for each output affects the rest of the circuit in ways which are not modeled in this approach.

The final phase assignment is output 707. The final phase assignment is the assignment for all outputs that will reduce the power consumption of the circuit.

Figure 8:
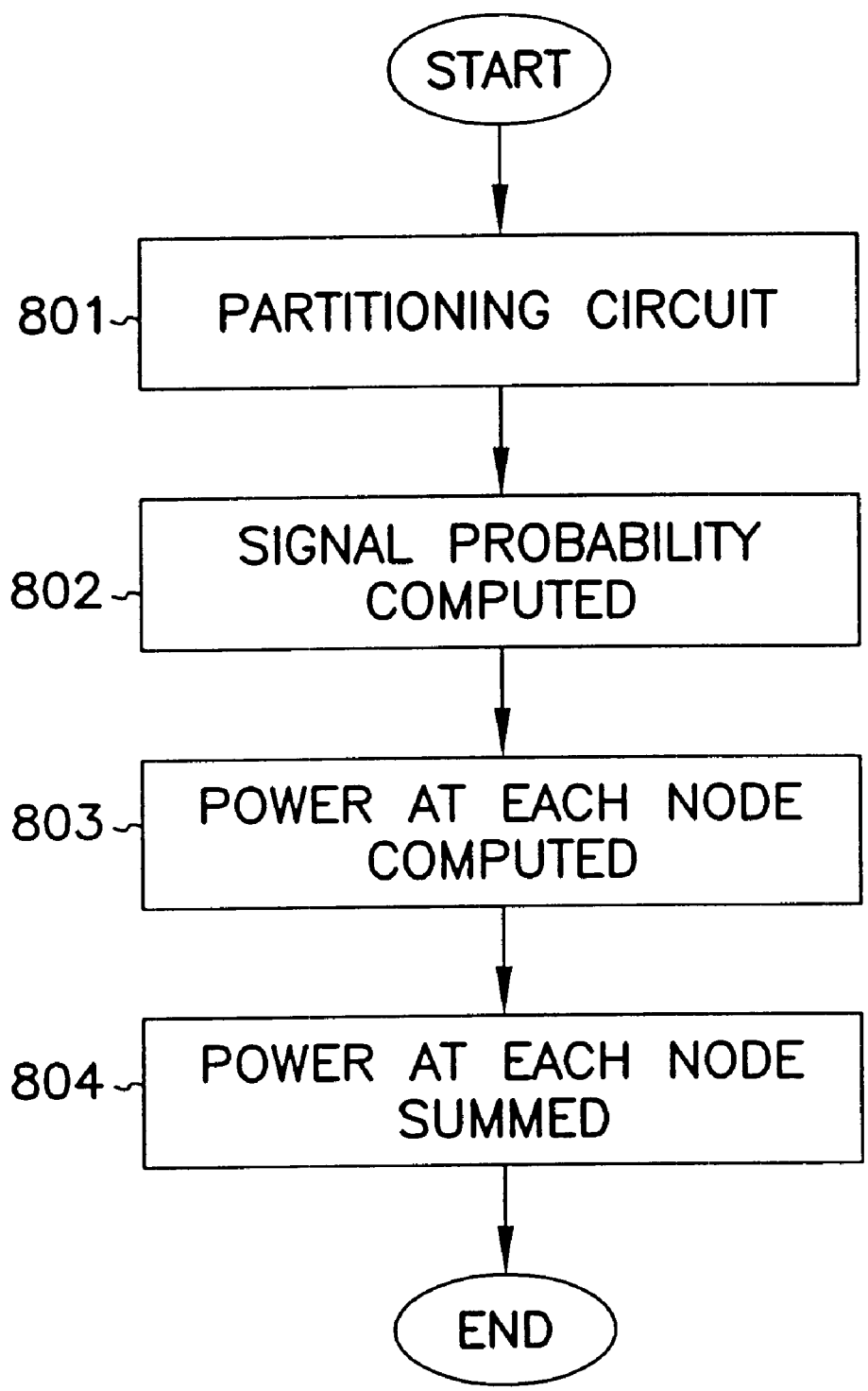
FIG. 8 is a method for computing power output according to an embodiment of the invention.
Figure 9A:
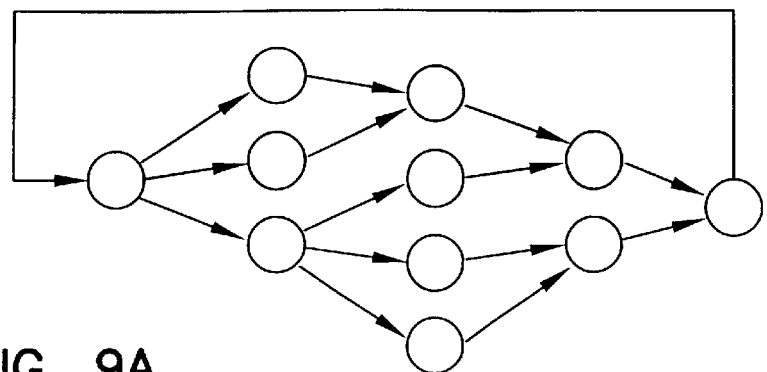
FIG. 9A shows a sequential circuit.
Figure 9B:
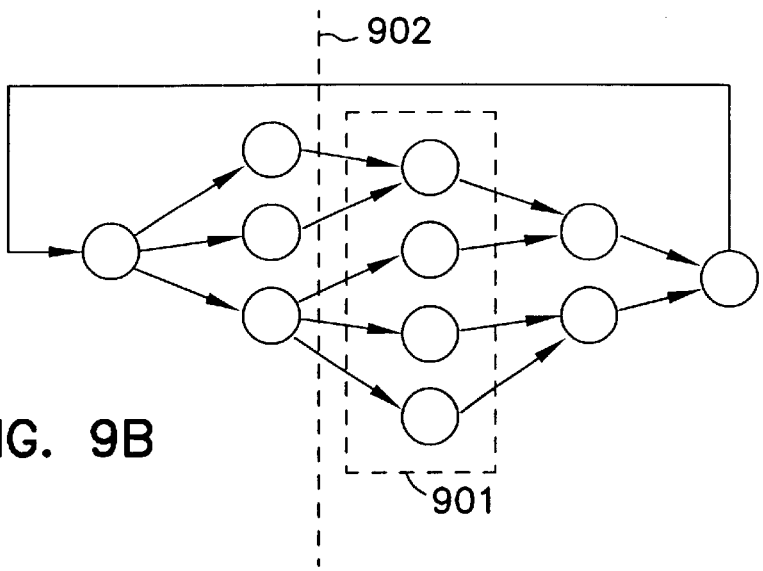
FIG. 9B shows a sequential circuit partitioned.
Figure 9C:
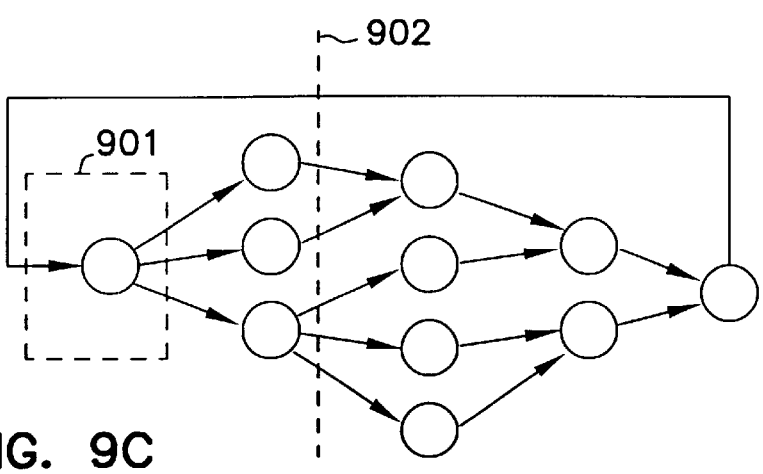
FIG. 9C shows a sequential circuit partitioned.
Figure 10A:
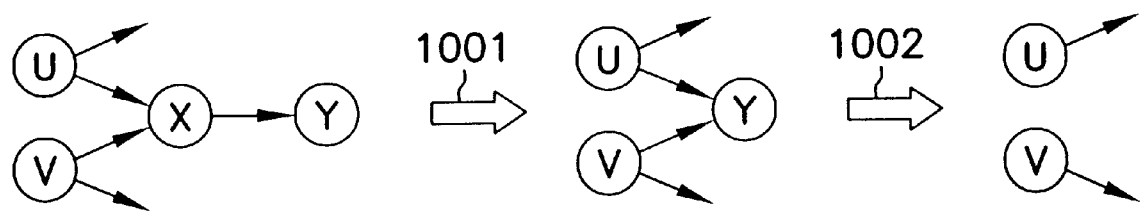
FIGS. 10A, 10B, 10C shows transformations to generate a MFVS.
Figure 10B:
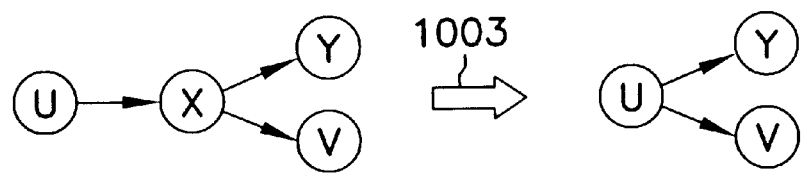
Figure 10C:
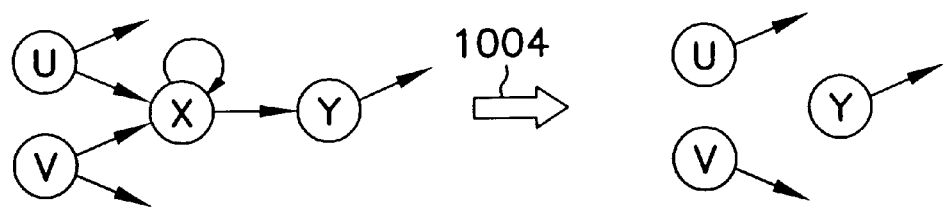

Referring to FIG. 8, a flowchart is shown for computing a power output of a circuit. The circuit is partitioned into combinational blocks 801. The circuit consists of sequential domino blocks. The sequential domino blocks are transformed into disjoint combinational blocks. Generally, a determination is made as to the minimum number of feedback loops to cut to partition the sequential blocks into combinational blocks. An enhanced minimum feedback vertex set heuristic that takes advantage of the properties of domino logic blocks to effectively partition sequential blocks into combinational blocks may be used. This heuristic requires transforming the circuit into an s-graph. FIGS. 9A, 9B, and 9C show a representation of a domino circuit in an s-graph with partitioning 902 and new primary inputs 901. FIG. 9A shows an original s-graph of a sequential circuit. FIG. 9B shows one partitioning of the circuit. FIG. 9C shows a second partitioning that results in a combinational block with fewer primary inputs. An s-graph is a directed graph representing structural dependencies (edges) among flip-flops (vertices). The nodes or vertices of the graph represent various gates of the circuit. The s-graph can be transformed to obtain a greatly reduced vertex set by using concepts of strongly connected components. FIGS. 10A, 10B, and 10C show three transformations performed on an s-graph to obtain the greatly reduced vertex set.

Figure 11:
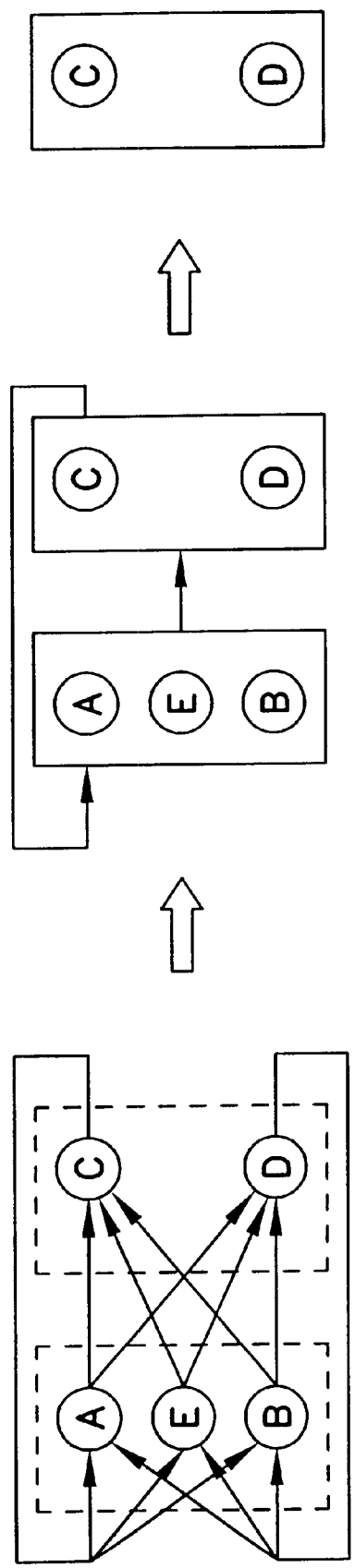
FIG. 11 shows a transformation according to an embodiment of the invention.

FIGS. 10A, 10B, and 10C shows the fanins and fanouts of a node X which is being eliminated from further consideration as a result of applying the transformations. In FIG. 10A, node X is ignored 1001 and then node Y is ignored 1002. In FIG. 10B, node X is ignored. In FIG. 10C, node X is removed 1004. The algorithm described in S. T. Chakradhar, A. Balakrishnan, and V. D. Agrawal, "An exact algorithm for selecting partial scan flip-flops", Design Automation Conference, pages 81–86, 1994 is used iteratively to apply three transformations and use the concepts of strongly connected components to reduce an s-graph, in polynomial time, to obtain a greatly reduced vertex set. A fourth transformation can be used to convert the greatly reduced vertex set into a minimum feedback vertex set. This fourth transformation can be used when none of the first three transformations can be used to further reduce the s-graph. The s-graph is transformed by grouping vertices with identical fanins and identical fanouts into a weighted supervertex as shown in FIG. 11. FIG. 11 shows the vertices A, B and E form a supervertex ABE with weight 3, and vertices C and D combine to form supervertex CD with weight 2. The greatly reduced vertex set is reduced to a minimum feedback vertex set. This can be accomplished by using heuristics or using exponential, but exact, algorithms. The resulting minimum feedback vertex set is a set of combinational blocks. The combinational blocks are blocks of the circuit without feedback to other blocks. Thus, the signal probability of one combinational block does not affect the signal probability of another combinational block. The resulting combinational blocks are disjoint blocks of the domino circuit.

The signal probability at each node of the circuit is computed 802. One way to do this is to use binary decision diagrams (BDDs) to compute the signal probability at each circuit node. See this paper, Sreejit Chakravarty, "On the complexity of Using BDDs for the Synthesis and Analysis of Boolean Circuits", In Allerton Conference on Communication, Control and Computing, pages 730–739, 1989. That paper discusses using symbolic representation techniques for circuits. The complexity of the calculations can be reduced by maximizing sharing of nodes in the reverse order binary decision diagrams (ROBDD). This reducing can be accomplished by utilizing that domino blocks are highly flattened and a node's average fanout is high, the overall circuit is highly convergent (nodes near the primary inputs have greater fanouts than nodes near the primary outputs), and most signals in a block of control domino logic feed gates at the same topological level in the circuit. Thus, there is a heavy overlap of logic cones in the domino implementation.

The BDD variables are ordered in the reverse of the order that the circuit inputs are first visited when the gates are topologically traversed and gates that are at the same topological level are traversed in the decreasing order of the cardinality of their fanout cones. The signal probability is computed incrementally by the nodes.

Figure 12A:
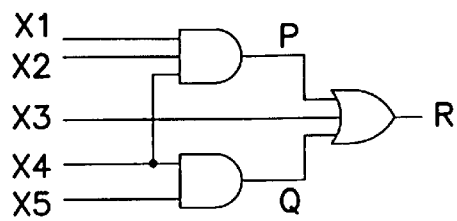
FIG. 12A depicts a circuit.
Figure 12B:
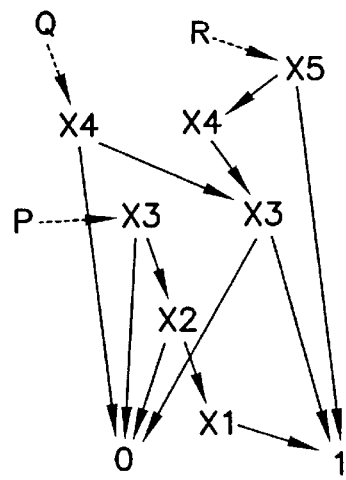
FIG. 12B shows two possible topological orders for visiting the gates.
Figure 12C:
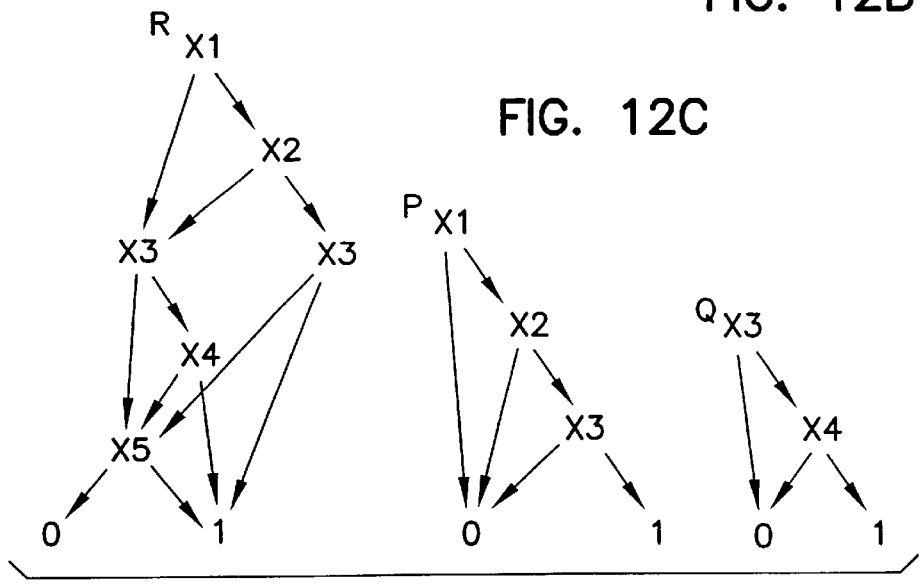
FIG. 12C shows topological ordering.
Figure 12D:
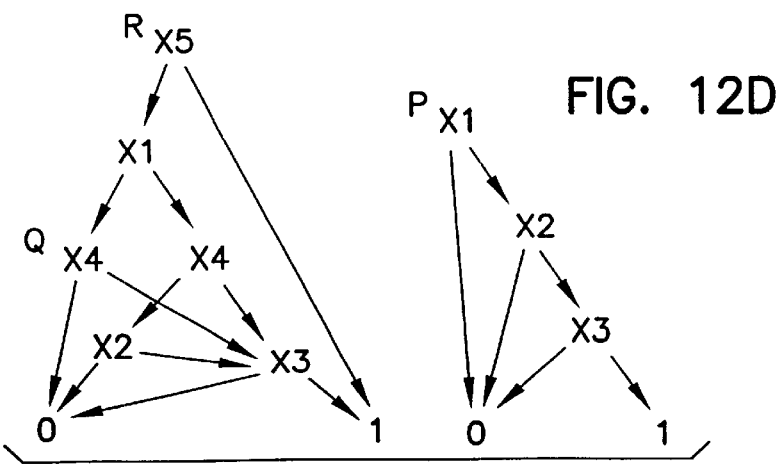
FIG. 12D shows the BDDs obtained if natural grouping is violated.

FIGS. 12A, 12B, 12C and 12D show an example of this BDD ordering. In FIG. 12A, a circuit with nodes P, Q and R is depicted. The two possible topological orders for visiting the gates are P, Q, R and Q, P, R as shown in FIG. 12B. The first order implies that primary inputs x1, x2, and x3 are used first and then x4 and x5. The input names stand for the variables in the BDDs which are constructed for all circuit nodes P, Q, and R. The initial BDD ordering should be x5, x4, x3, x2, x1. It only requires 7 non-leaf BDD nodes to represent all the circuit nodes. The second row, FIG. 12C, of BDDs are obtained when the topological ordering x1, x2, x3, x4, x5 is used. This requires 11 BDD nodes. The bottom row, FIG. 12D, shows the BDDs obtained if the natural grouping is violated and the primary inputs are arbitrarily combined. The ordering here is x5, x1, x4, x3, x2. The last BDD variable ordering requires 9 non-leaf BDD nodes and has the variable x1 "unnaturally sandwiched" between x5 and x4. The signal probability at each circuit node can be computed by using the BDD variables.

The power at each node is computed 803. The power at each node is equal to the signal probability times a load capacitance minus a penalty 803. The power of each node is summed together 804. The formula is shown here:

$$\Sigma S_j \times C_j - P_j$$

The penalty for each node is determined by the particular gate type. The penalty relates to the balance the tradeoff between power savings and circuit performance. It is well known that certain logic structures such as domino AND gates are slower than other structures such as domino OR gates. The reason is that AND gates have transistors in series. For aggressive circuit designs, the penalty for using an excessive number of AND gates may be too high, therefore we account for this.

Figure 13:
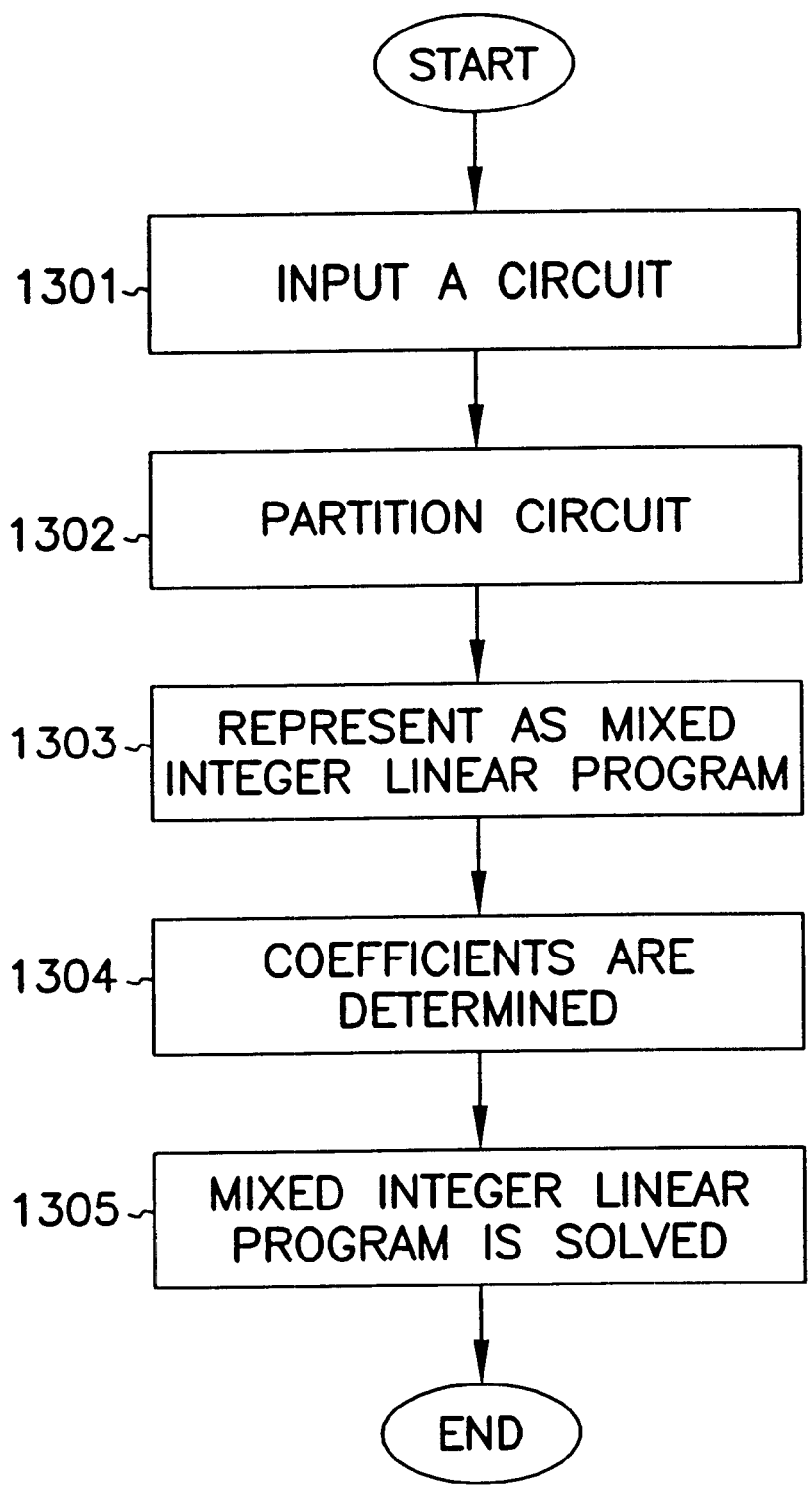
FIG. 13 is a method for reducing power consumption of a domino circuit according to an embodiment of the invention.

Referring to FIG. 13, a method for reducing power is shown. This method takes as input a circuit 1301. The circuit implements both phases of the outputs, has been minimized by traditional logic minimization, has been technology mapped to any existing domino library and has no intrinsic inverters. Any type of circuit such as sequential or combinational is allowed.

The circuit is partitioned into combinational blocks 1302. The circuit is represented as an s-graph.

Figure 14:
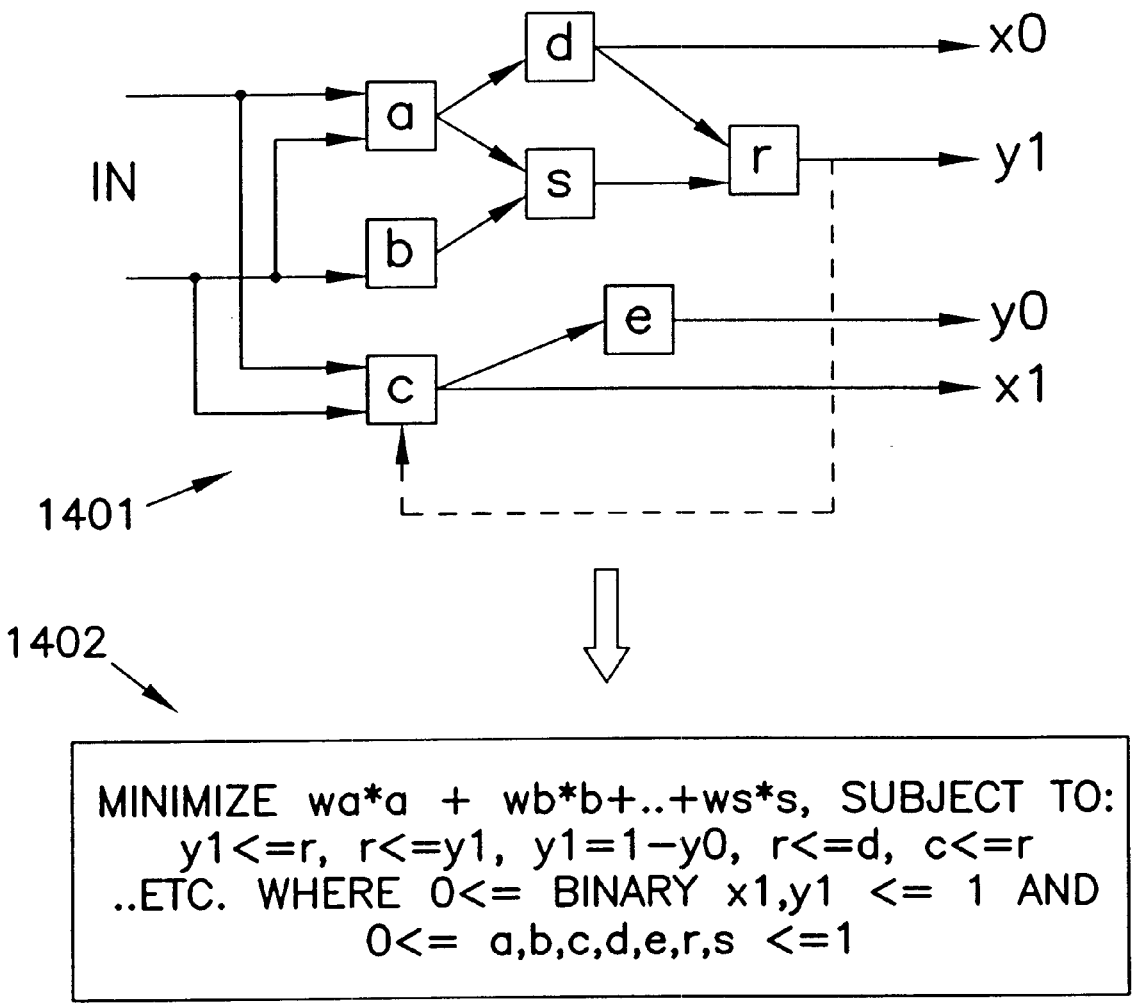
FIG. 14 shows a domino circuit translated to an ILP representation.

The circuit is represented as a very low complexity mixed-integer linear program 1303. FIG. 14 shows an s-graph of a circuit and an equivalent mixed integer linear program (ILP). This representation can be done by exploiting the following three major facts: (1) The logic functionality of the logic nodes may be ignored and only their topology or connectivity need be considered. Each directed edge between two logic nodes turns into a simple constraint in the mixed integer linear program. (2) Theoretical arguments prove that the linear program may involve "binary" variables no more than the number of primary outputs to be optimized. Integer variables account for exponential complexity in an ILP. All other variable in the ILP can be made continuous bounded by 0 and 1, making it significantly tractable. (3) Continuous variables are further reduced by grouping nodes into "equivalence" classes.

A binary variable represents each output. Some outputs may be set according to a user so that they are not modified so that if a user wants some logic to remain unchanged, only the other phase assignments affecting the other outputs are modified.

The nodes are represented by continuous variables bounded by 0 and 1. The nodes also have a coefficient representing the costs of that gate in terms of power.

The coefficients for the variables representing the nodes are determined 1304. Each node or gate has a coefficient determined for it. The cost parameter is power. The coefficient value depends on how it is being modeled. If power is being modeled as a linear function of gate area, the coefficient is set to the area estimate for that gate or node. If power is modeled as an average number of gate toggles, the coefficient is set to the activity at that gate. The activity at that gate is the signal probability. Ways to determine signal probability are described earlier.

The power may also be modeled as an average weighted switched power. The concern here is how much capacitance is switched on average. The switching capacitance for the gate is set to an estimated capacitance. The coefficient is then equal to the activity at the gate times the switching capacitance. If power is modeled as a wire load model, the coefficient is determined by the fanin wire capacitance contribution modulated by the driver gate's activity. The driver gate is the gate driving this fanin. The coefficient is set to the gate cost plus the activity at each gate times the fanin wire capacitance.

If logical depth or gain is modeled, the coefficient is set to the gate cost times the logical depth of that gate.

With the coefficients generated, the mixed integer linear program is solved 1305. The gates and outputs are implemented if the corresponding variable is 1 in the mixed integer linear program's solution. The gates and outputs with corresponding variables that are not 1 are not implemented. The phase assignments are assigned. See also, the application titled "A METHOD FOR REDUCING NETWORK COSTS AND ITS APPLICATION TO DOMINO CIRCUITS", Ser. No. 09/347839, filed Jul. 2, 1999 by Patra for a further discussion of the mixed integer linear program applied to domino circuits.

Figure 15:
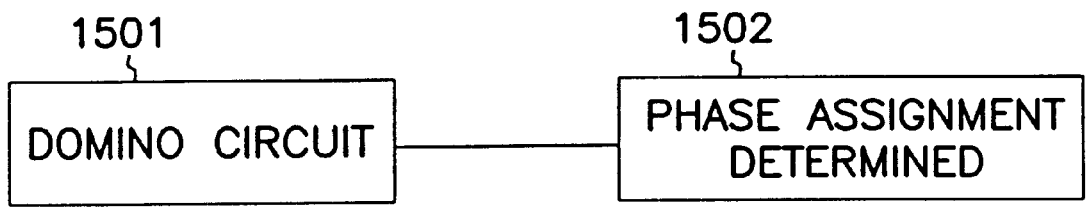
FIG. 15 is a system according to an embodiment of the invention.

Referring to FIG. 15, a system for reducing power is shown. The system includes a domino circuit 1501 and a phase assignment determiner 1502. The domino circuit 1501 has a phase assignment. The phase assignment determiner 1502 determines a new phase assignment for the domino circuit 1501 that reduces power consumption by the circuit. The power consumption of a circuit is related to the phase assignment for the circuit. One way to determine the new phase assignment is to determine the phase assignment iteratively until power is reduced. Another way to determine the new phase assignment is to calculate a minimum power phase assignment by using a mixed integer linear approach. Generally, a heuristic approach can be faster than a mixed integer approach but the mixed integer approach can generally reduce power consumption more.

Figure 16:
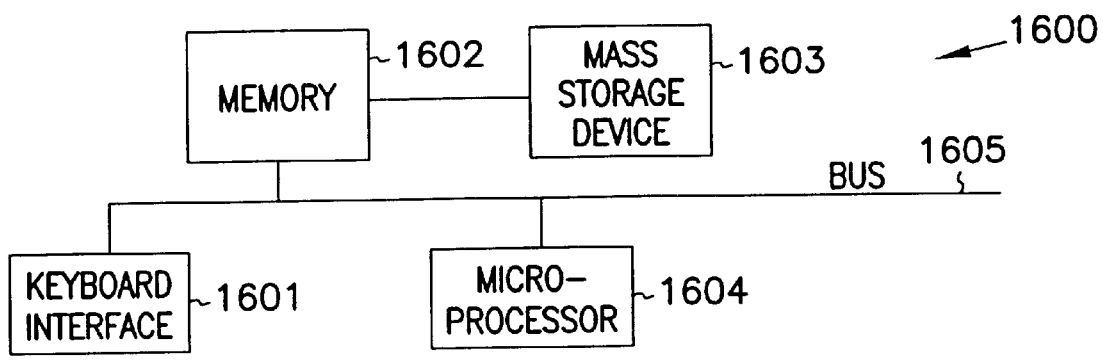
FIG. 16 is a computer system with which embodiments of the invention may be used.

FIG. 16 is a block diagram of a computer system 1600. The computer system is an example of a system on which a computer-readable medium having computer-executable instructions for reducing power consumption of domino circuits may be run. The computer system 1600 comprises bus 1605, keyboard interface 1601, external memory 1602, mass storage device 1603 and processor 1604. Bus 1605 can be a single bus or a combination of multiple buses. Bus 1605 provides communication links between components in the computer system. Keyboard interface 1601 can be a dedicated device or can reside in another device such as a bus controller or other controller. Keyboard interface 1601 allows coupling of a keyboard to the computer system and transmits signals from a keyboard to the computer system. External memory 1602 can comprise a dynamic random access memory (DRAM) device, a static random access memory (SRAM) device, or other memory devices. External memory 1602 stores information from mass storage device 1603 and processor 1604 for use by processor 1604. Mass storage device 1603 can be a hard disk drive, a floppy disk drive, a CD-ROM device, or a flash memory device. Mass storage device 1603 provides information to external memory 1602.

Processor 1604 includes a single register file containing both speculative values and architecturally visible values. The processor 1604 may be compatible with, but is not limited to, processors such as an Intel® architecture processor, manufactured by Intel Corporation of Santa Clara, Calif. In alternate embodiments, the processor 1604 is compatible with a PowerPC™ architecture processor, an Alpha™ architecture processor, and the like. It is appreciated that at least some embodiments of the processor of the present invention are pipelined.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefor, it is manifestly intended that this invention be limited only by the following claims and equivalents thereof.

We claim:

1. A method for reducing power consumption of a domino circuit comprising:

generating an initial output phase assignment for outputs of the domino circuit;

computing a first power consumption of the domino circuit using the initial output phase assignment output of the circuit;

generating a plurality of additional output phase assignments; and for each one of the plurality of additional output phase assignments, performing the following:
evaluating a power consumption of the domino circuit using each of the plurality additional output phase assignments;
comparing the power consumption of the domino circuit using each of the plurality additional output phase assignments to the first power consumption;
selecting either the initial output phase assignment or one of the plurality additional output phase assignments which results in a lowest power consumption by the domino circuit compared to the first power consumption;

wherein evaluating the power consumption comprises:
partitioning the domino circuit into combinational blocks;
computing a signal probability at each node of the domino circuit;
computing power at each of the nodes of the domino circuit, wherein the power at each of the nodes is equal to the signal probability times a load capacitance minus a penalty value; and
summing the power at each of the nodes of the domino circuit.

2. The method of claim 1 wherein partitioning the domino circuit into combinational blocks comprises:

transforming the domino circuit into an s-graph;

transforming the s-graph by grouping vertices which have identical fanins and identical fanouts into weighted supervertex;

iteratively applying three transformations and using the concepts of strongly connected components to reduce the s-graph in polynomial time to obtain a greatly reduced vertex set; and reducing the greatly reduced vertex set to a minimum feedback vertex set.

3. The method of claim 1 wherein computing a signal probability at each node of the domino circuit comprises:

maximizing sharing of nodes;

ordering the nodes; and using binary decision diagram variables to compute the signal probability at each domino circuit node.

4. A method for computing signal probabilities for a domino circuit comprising:

determining a minimum feedback set of the domino circuit;

sorting the minimum feedback set topologically;

ordering binary decision diagram variables; and computing activity for each internal node.

5. A method for reducing power of a domino circuit utilizing a mixed integer linear solution comprising:

partitioning the domino circuit into combinational blocks;

representing the domino circuit as a mixed integer linear program;

generating coefficients for variables of the mixed integer linear program;

solving the mixed integer linear program; and implementing only those gates and outputs of the domino circuit that have corresponding variables equal to one.

6. The method of claim 5 wherein the combinational blocks are an enhanced minimum feedback vertex set.

7. The method of claim 5 wherein the partitioning the domino circuit into combinational blocks comprises:

transforming the domino circuit into an s-graph;

transforming the s-graph by grouping vertices which have identical fanins and identical fanouts into weighted supervertex;

iteratively applying three transformations and using the concepts of strongly connected components to reduce the s-graph in polynomial time to obtain a greatly reduced vertex set; and reducing the greatly reduced vertex set to a minimum feedback vertex set.

8. The method of claim 5 wherein generating coefficients comprises:

upon power being modeled as a linear function of gate area, setting the coefficient for each node to the area estimate for that node;

upon power being modeled as an average number of gate toggles, setting the coefficient for each node to the activity at that node;

upon power being modeled as an average weighted switch power, setting the coefficient for each node to the activity at that node times the switching capacitance;

upon power being modeled as a wire load model, setting the coefficient for each node to a gate cost plus the activity at each gate times the fanin wire capacitance; and upon power being modeled as a logical effort, setting the coefficient for each node to the gate cost times the logical effort of that gate.

9. The method of claim 5 further comprising:

determining by a user that one or more outputs are to remain unaltered; and excluding those outputs from being excluded from implementation.

10. A computer-readable medium having computer-executable instructions for instructing a computer to perform a method of determining an output phase assignment which reduces power consumption of a domino circuit, the method comprising:

generating an initial output phase assignment for outputs of the domino circuit;

computing a first power consumption of the domino circuit based on the initial output phase assignments;

generating a plurality additional output phase assignments;

for each of the plurality additional output phase assignments, performing the following:

evaluating a power consumption of the domino circuit using each of the plurality additional output phase assignments;

comparing the power consumption of the domino circuit using each of the plurality additional output phase assignments to the first power consumption;

selecting either the initial output phase assignment or one of the plurality additional output phase assignments which results in a lowest power consumption by the domino circuit compared to the first power consumption;

wherein computing power output comprises:

determining a minimum set of feedback loops to cut from the domino circuit;

cutting the minimum set of feedback loops into the combinational blocks;

computing a signal probability at each node of the domino circuit;

computing power at each node, wherein the power at each node is equal to the signal probability times a load capacitance minus a penalty; and summing the power at each node.

11. A computer-readable medium having computer-executable instructions for reducing power consumption of a domino circuit comprising:

partitioning the domino circuit into combinational blocks;

representing the domino circuit as a mixed integer linear program;

generating coefficients for variables, wherein the coefficient is modeled by area and the coefficient is set to an area estimate;

solving the mixed integer linear program; and implementing only those gates and outputs that have corresponding variables equal to one.

12. The method of claim 4, further comprising:

generating initial phase assignment for outputs of the domino circuit; and determining a final phase assignment that reduces power consumption of the domino circuit, the final phase assignment is selected from at least one additional phase assignment determined from the activity computed for each internal node.

* * * * *